United States Patent
Arledge et al.

(10) Patent No.: US 6,653,915 B1
(45) Date of Patent: Nov. 25, 2003

(54) COAXIAL TRANSMISSION LINES HAVING GROUNDING TROUGHS ON A PRINTED CIRCUIT BOARD

(75) Inventors: John K. Arledge, Ft. Lauderdale, FL (US); Joaquin Barreto, Coral Springs, FL (US); Thomas J. Swirbel, Davie, FL (US); Jeffrey A. Underwood, Sunrise, FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/378,351

(22) Filed: Aug. 20, 1999

Related U.S. Application Data

(62) Division of application No. 09/061,112, filed on Apr. 16, 1998, now Pat. No. 6,000,120.

(51) Int. Cl.⁷ .................................................. H01P 3/08
(52) U.S. Cl. ........................................ 333/238; 333/243
(58) Field of Search ................................. 333/238, 246, 333/243

(56) References Cited

U.S. PATENT DOCUMENTS

| | | | |
|---|---|---|---|
| 3,613,230 A | 10/1971 | Griff | 29/624 R |
| 4,460,880 A | 7/1984 | Turner | 333/238 |
| 4,673,904 A | 6/1987 | Landis | 333/238 |
| 4,776,087 A | 10/1988 | Cronin et al. | 333/243 X |
| 4,845,311 A | 7/1989 | Schreiber et al. | 333/243 X |
| 5,426,399 A | 6/1995 | Matsubayashi et al. | 333/238 X |
| 5,461,353 A | 10/1995 | Eberhardt | 333/246 |
| 5,574,415 A | 11/1996 | Peterson | 333/243 X |

FOREIGN PATENT DOCUMENTS

JP    04-139783    5/1992

*Primary Examiner*—Benny Lee
(74) *Attorney, Agent, or Firm*—Randi L. Dulaney; Hisashi D. Watanabe

(57) ABSTRACT

A method of forming a coaxial transmission line on a high density PCB. A metal layer (102) on the PCB (104) forms the bottom part of the shield, and is covered by a first dielectric (112). Two parallel trenches (122) are formed in the first dielectric to reveal part (123) of the metal strip. The signal conductor (132) is then formed on the first dielectric. A second dielectric (142) covers the signal conductor and the first dielectric. A second set of two parallel trenches (172) are formed in the second dielectric immediately above the first two trenches. Metal deposit (182) is plated in the parallel trenches to contact the metal strip, and also covers a portion of the second dielectric that lies between the trenches, to create a shield. The resulting coaxial transmission line has a center conductor insulated from the shield by the dielectrics.

7 Claims, 3 Drawing Sheets

COAXIAL TRANSMISSION LINES HAVING GROUNDING TROUGHS ON A PRINTED CIRCUIT BOARD

CROSS REFERENCE TO RELATED APPLICATIONS

This is a division of application Ser. No. 09/061,112, filed Apr. 16, 1998, now U.S. Pat. No. 6,000,120 and assigned Motorola Inc.

TECHNICAL FIELD

This invention relates in general to printed circuit boards, and more particularly to coaxial transmission lines on high density printed circuit boards.

BACKGROUND

Shielded transmission lines are commonly used to ensure that high speed signals and radio frequency (RF) signals are transmitted intact, without interference or corruption by other signals, and to ensure that these signals do not emanate unwanted electronic emissions. The traditional way of insulating or protecting these signals has been to use shielded cable that consists of a central conductor within a plastic dielectric material, surrounded by a braided conductor. Although this construction is extremely effective in transmitting signals over a distance, it requires cumbersome interconnects, and is not useful for transmitting signals over small distances, as on a printed circuit board, for example. Numerous methods have been employed to create a shielded signal path on printed circuit boards (PCB) over the years, with one option being to sandwich the signal conductor in the interior of the PCB between two outer ground planes. Unfortunately, this construction only protect the signal conductor on the top and bottom sides, not the two lateral sides. In addition, it requires considerable real estate on the PCB surfaces and increases the laminate thickness significantly. Incorporating shielded conductors in a high density interconnect (HDI) PCB would be a valuable addition to the art.

DETAILED DESCRIPTION OF THE PREFERRED EMBODIMENT

Figure 1:
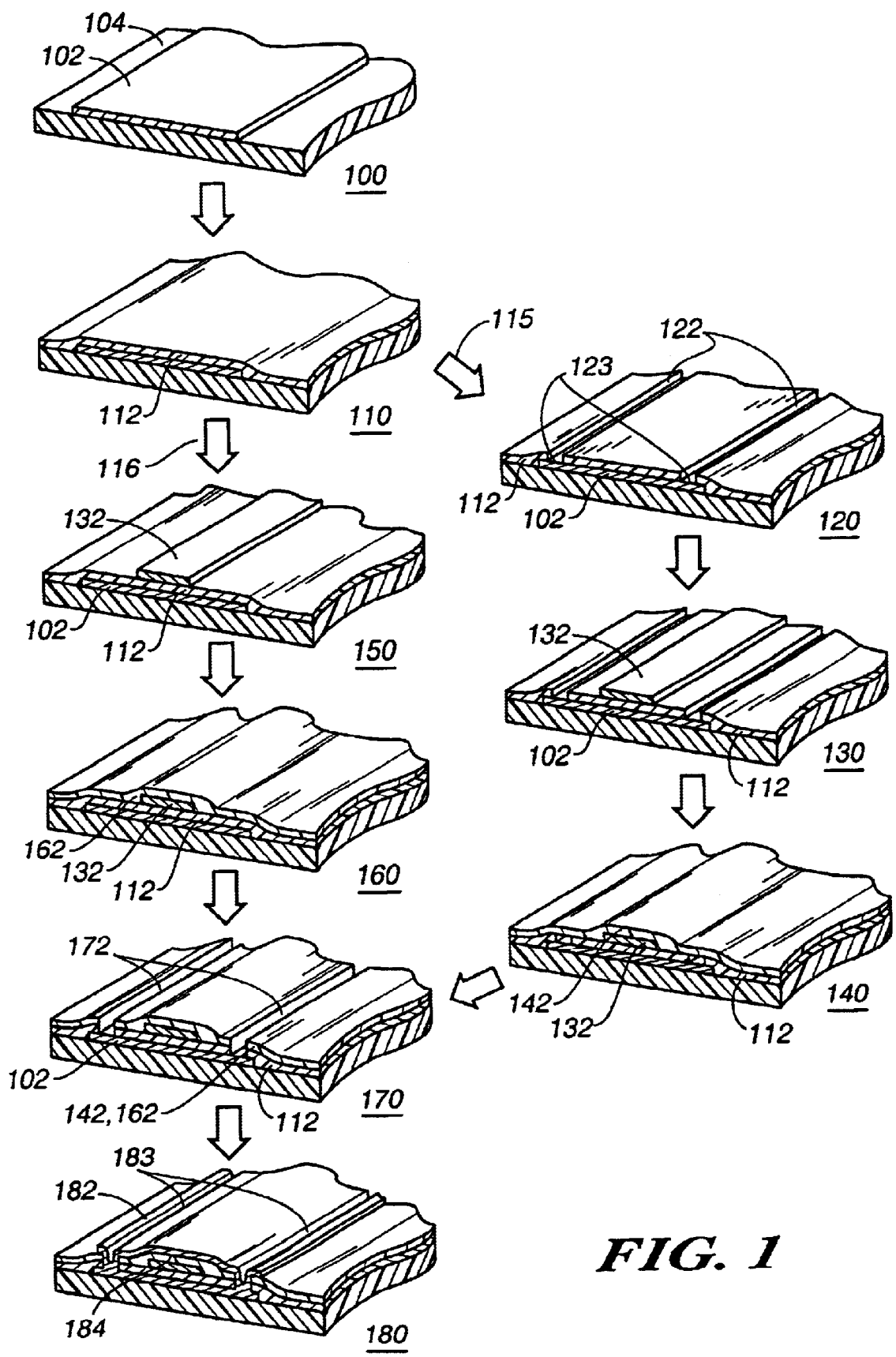
FIG. 1 is a pictorial flowchart depicting typical cross-sectional views of a coaxial transmission line on a PCB, in accordance with the invention.

A coaxial transmission line is formed on a high density PCB by starting with a metal strip on the PCB that forms the bottom part of the shield. The metal strip is covered by a first layer of dielectric material. A signal conductor is then formed on the first dielectric layer. A second layer of dielectric material covers the signal conductor and the first dielectric layer. Two parallel trenches are formed in both layers of dielectric material to reveal part of the lower metal strip. The trenches can be formed by photolithography or by laser methods. Metal is plated in the parallel trenches to contact the metal strip, and also covers a portion of the second dielectric that lies between the trenches, to create a shield. The resulting coaxial transmission line has a center conductor insulated from the shield by the dielectrics.

While the specification concludes with claims defining the features of the invention that are regarded as novel, it is believed that the invention will be better understood from a consideration of the following description in conjunction with the drawing figures.

FIG. 1 is a pictorial flow chart depicting the steps involved in fabricating a coaxial transmission line in accordance with the preferred embodiment of the invention. Each step in the flow chart shows a representative cross-sectional view of an HDI printed circuit board at the various stages of fabrication. The coaxial transmission line begins formation at step 100 where a first layer of metal or metal layer 102 is deposited upon an insulating substrate 104. The insulating substrate can be any form of material used in the electronics industry and is typically a material such as glass-reinforced epoxy laminate, glass-reinforced polyimides laminate, flexible polyimide or polyester, or ceramic. The metal layer 102 is formed on the substrate 104 in the form of a lengthwise strip or conductor. This formation can be done by any number of conventional methods and is typically performed by photolithography and chemical etching as is well known in the art. Metal layer 102 will ultimately serve as the bottom portion of the shield in the coaxial transmission line. At the next step (110) a layer of dielectric material 112 is deposited on the surface of the substrate 104 and covers the metal layer 102. Dielectric material 112 can either be a photoimageable material, such as photo resist, or it can be other types of dielectric such as an epoxy or polyimide.

If a photoimageable dielectric material is used, then the next step follows the path shown by the arrow 115. At step 120, a first set of two substantially parallel apertures or troughs 122 are formed in the dielectric material 112. This set of apertures 122 is typically formed using conventional photolithographic techniques such that the resulting apertures or trenches that are formed in the photoimageable dielectric material 112 extend down to the metal layer 102 to reveal portions 123 of the surface of the metal. At step 130, a second layer of metal or second conductor 132 is added on the surface of the dielectric material 112 directly above the metal layer 102. This second layer of metal 132 is patterned so as to form a narrow strip or conductor. This conductor 132 will ultimately serve as the center conductor or signal line of the coaxial transmission line. Conductor 132, in addition to being on the top layer of dielectric material 112, lays essentially at the midpoint between the two substantially-parallel apertures 122 At step 140, a second layer 142 of photoimageable dielectric material is added over the conductor 132 and dielectric material 112. Step 170 shows the formation of two substantially-parallel apertures or troughs 172 in the dielectric layer 142 down to the metal layer 102 The apertures 172 are formed in dielectric layer 142 by conventional photolithographic means. It should be noted that apertures 172 lay directly above and in conjunction with the first set of apertures 122, so that both sets of apertures 122 and 172 combine to form a single set that reveals portions of the surface of the metal layer 102. Finally, in step 180, a metal deposit is formed in the apertures 172. The metal deposit can be done in any number of conventional means, such as by sputtering, electroless plating, additive plating, etc. The metal deposit or third conductor, 182 also covers a portion 184 of the second dielectric layer 142 that lays directly over the second conductor 132 and between the two sets of substantially-parallel apertures 172. The third conductor 182 includes two substantially parallel troughs 183 formed therein and along the two substantially parallel troughs 172 of the second dielectric layer 142. This metal deposit 182 is formed in such a way that the metal deposit makes electrical connection with the first metal layer 102 and essentially surrounds the center conductor 132 to form an electromagnetic shield around it. Taken together, the metal deposit 182, the center conductor 132, and the dielectric materials between the center conductor and the metal deposit form the coaxial transmission line.

If a non-photoimageable dielectric material, such as epoxy or polyimide, is used, then the next step follows the path shown by the arrow 116. At step 150, a second layer of metal 132 is added on the surface of the dielectric material 112 directly above the metal layer 102. This second layer of metal 132 is patterned so as to form a narrow strip or conductor. This conductor 132 will ultimately serve as the center conductor or signal line of the coaxial transmission line. Conductor 132, in addition to being on the top layer of dielectric material 112, lays essentially at the centerline of the metal layer 102. At step 160, a second layer 162 of dielectric material is added directly on top of the conductor 132 and dielectric material 112. Step 170 shows the formation of two substantially-parallel apertures 172 in the two dielectric layers 112 and 162 down to the metal layer 102. The apertures 172 are formed simultaneously through both of layers 112 and.162 by, for example, a laser, or plasma etching. Excimer lasers are particularly suited for his type of application since the metal layer 102 directly below the polymer dielectric layers will serve to reflect the energy and terminate the lasing process.

An alternate embodiment of the invention follows essentially the same steps, but rather than creating a coaxial transmission line, a waveguide is formed. This is done by following the same procedure as shown in FIG. 1, however, steps 150, 130 are eliminated and the center conductor 132 is not employed.

Figure 2:
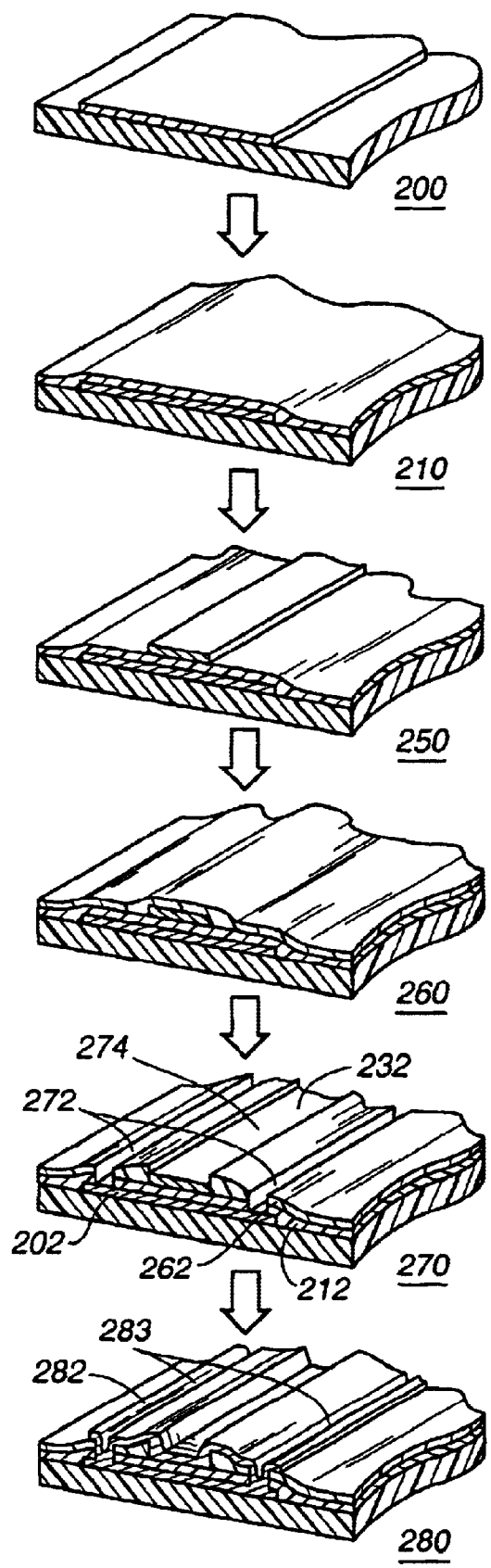
FIG. 2 is a pictorial flowchart depicting typical cross-sectional views of a waveguide on a PCB, in accordance with the invention.

In another embodiment of the present invention, as shown in FIG. 2, a waveguide having a ridge can also be formed. It should be noted that the techniques used to form the ridge waveguide can be either photolithographic or laser, as described in the previous paragraph. When using photolithographic techniques, photoimageable dielectric materials are employed and the parallel apertures are photo defined. For sake of brevity, only the process wherein non-photoimageable dielectrics are employed will be described, as the use of photoimageable dielectrics has already been explained. The first four steps 200, 210, 250, and 260 are essentially the same as steps 100, 110, 150 and 160 previously described with respect to FIG. 1. However, in step 270 during the process of forming the two parallel apertures or troughs 272, an additional third parallel aperture 274 is formed only in the second dielectric layer 262. Note that apertures 272 penetrate through both dielectric layers 212 and 262 in order to reveal the first metal layer 202, however, aperture 274 only penetrates dielectric layer 264 to completely reveal conductor 232. Forming the metal deposit in step 280 is similar to step 180 previously described with respect to FIG. 1, and is performed in any number of conventional means, such as by sputtering, electroless plating, additive plating, etc. A metal deposit or third conductor 282 (see step 280) is formed in apertures 272 and 274 (see step 270) and over that portion of the dielectric layer 262 that lies between the two apertures 272. The third conductor 282 includes two substantially parallel troughs 283 formed therein and along the two substantially parallel troughs 272 of the second dielectric layer 262 (see step 270). Thus, metal deposit 282 ends up forming the outer perimeter of the waveguide with metal layer 202 (see step 270) serving as the bottom of the waveguide and layer 274 (see step 270) serving as a ridge in the wave guide.

Figure 3:
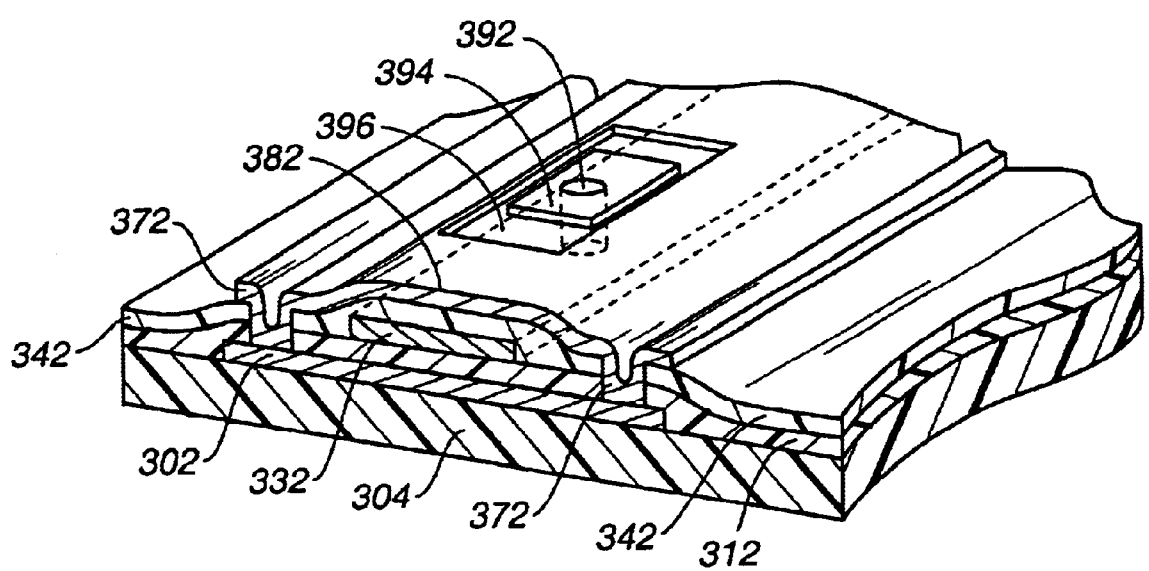
FIG. 3 is a perspective view of a coaxial transmission line termination on a PCB in accordance with the invention.

In still another embodiment of the invention, the coaxial transmission line, as previously described, can have a termination on it to enable top side connection to the transmission line. Refer now to FIG. 3, an isometric cross-sectional view of the coaxial transmission line with a termination. The coaxial transmission line is formed in essentially the same manner as described for the embodiment shown in FIG. 1, and can also use photoimageable or non-photoimageable dielectric materials. A substrate 304 is provided that contains a first metal layer 302 thereon. A first dielectric material 312 is provided to cover the first metal layer and also the substrate surface. A metal strip 332 is then formed on the first dielectric layer 312 such that the metal strip lays directly above the first metal layer 302. A second dielectric layer 342 is then deposited over the first dielectric layer 312 and the metal strip 332. Two substantially parallel apertures 372 are formed in the first and second dielectric layers on opposite sides of the metal strip such that portions of the first metal layer are revealed by these apertures. As in previous embodiments, these apertures are in the form of trenches or strips and are essentially parallel to each other and run along the edge of the ground plane or first metal layer 302. A via 392 is also formed in the second dielectric layer. In the case of HDI circuit boards, this via is a micro via and is typically formed either by photolithography or by laser, depending upon what types of dielectric materials are being used. The via 392 only penetrates through the dielectric layer 342 and terminates at conductor 332 such that a portion of conductor 332 is revealed by the via. The metal deposit 382 is then etched so as to form a window frame 396 in the surface of the metal deposit directly above the conductor 332 and surrounding the via 392. The window frame 396 and the metal deposit 382 ends up forming a pad 394 of metal around the via 392, electrically isolating via 392 from the remainder of the metal deposit. Window frame 396 is etched down to the surface of the second dielectric layer 342 in order to reveal the surface of this dielectric layer. As noted in previous embodiments, the apertures 372 and via 392 can be formed either photolithographically or by laser.

In summary, our novel method provides a system wherein coaxial transmission lines and waveguides can be formed in high-density interconnect circuit boards in a cost effective and space effective manner. Because of the unique capabilities afforded a designer by our novel HDI process techniques, several transmission line structures can be fabricated in a way that has never been possible with conventional printed circuit board technology. These transmission lines and waveguides will find good application in areas of high-speed circuitry and RF applications. While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A coaxial transmission line having a termination to enable top side connection to the coaxial transmission line, comprising;
   a planar insulating substrate having a first conductor disposed thereon;
   a first dielectric layer disposed over the substrate and the first conductor,
   the first dielectric layer having two substantially parallel troughs provided therein to reveal end portions of the first conductor;

a second conductor disposed on the first dielectric layer and centered between the two troughs;

a second dielectric layer disposed on the first dielectric layer and the second conductor, the second dielectric layer having two substantially parallel troughs provided therein coincidental with the two substantially parallel troughs in the first dielectric layer, so as to reveal said end portions of the first conductor;

a third conductor disposed on the second dielectric layer, as well as in the two substantially parallel troughs of the first dielectric layer and in the two substantially parallel troughs of the second dielectric layer so as to make physical and electrical contact with said revealed end portions of the first conductor to define peripheral conductors, and the third conductor to also lie above the second conductor, the third conductor having an opening provided therein to reveal a portion of the second dielectric layer; and a metal pad provided in said opening and arranged such that the metal pad does not contact the third conductor, said metal pad having a conductive via provided therein, said conductive via extending through the second dielectric layer to reveal a portion of the second conductor and providing electrical connection between the metal pad and the second conductor, wherein the third conductor includes two substantially parallel troughs situated within the peripheral conductors and along the two substantially parallel troughs of the second dielectric layer.

2. The coaxial transmission line as described in claim 1, wherein the first, second and third conductors are respectively comprised of copper.

3. The coaxial transmission line as described in claim 1, wherein the planar insulating substrate is a laminated structure having glass reinforcement.

4. A coaxial transmission line on a printed circuit board, comprising:

a first conductor disposed on a substrate;

a first dielectric layer disposed over the substrate and the first conductor; the first dielectric layer having two substantially parallel troughs provided therein to reveal end portions of the first conductor;

a second conductor disposed on the first dielectric layer and centered between the two troughs;

a second dielectric layer disposed on the first dielectric layer and the second conductor, the second dielectric layer having two substantially parallel troughs provided therein coincidental with the two substantially parallel troughs in the first dielectric layer, so as to reveal said end portions of the first conductor; and a third conductor disposed on the second dielectric layer, as well as in the two substantially parallel troughs of the first dielectric layer and in the two substantially parallel troughs of the second dielectric layer so as to make physical and electrical contact with said revealed end portions of the first conductor to define peripheral conductors, and the third conductor to also lie above the second conductor, and wherein the third conductor includes two substantially parallel troughs situated within the peripheral conductors and along the two substantially parallel troughs of the second dielectric layer.

5. The coaxial transmission line as described in claim 4, wherein the first, second and third conductors are respectively comprised of copper.

6. The coaxial transmission line as described in claim 4, wherein the substrate is a laminated structure having glass reinforcement.

7. The coaxial transmission line as described in claim 4, wherein the first and second dielectric layers are respectively comprised of photoimageable materials.

* * * * *